(12) United States Patent
Chen et al.

(10) Patent No.: US 10,574,236 B2
(45) Date of Patent: Feb. 25, 2020

(54) LEVEL SHIFTER WITH BYPASS CONTROL

(71) Applicant: ARM Limited, Cambridge (GB)

(72) Inventors: Andy Wangkun Chen, Austin, TX (US); Cagla Cakir, Austin, TX (US)

(73) Assignee: ARM Limited, Cambridge (GB)

( * ) Notice: Subject to any disclaimer, the term of this patent is extended or adjusted under 35 U.S.C. 154(b) by 152 days.

(21) Appl. No.: 15/682,327

(22) Filed: Aug. 21, 2017

(65) Prior Publication Data

US 2019/0058475 A1 Feb. 21, 2019

(51) Int. Cl.

| | | |
|---|---|---|
| *H03K 19/0185* | (2006.01) | |
| *G11C 7/10* | (2006.01) | |
| *H03K 3/0233* | (2006.01) | |
| *G11C 8/06* | (2006.01) | |
| *H03K 3/356* | (2006.01) | |
| *G11C 5/14* | (2006.01) | |

(52) U.S. Cl.
CPC ....... *H03K 19/0185* (2013.01); *G11C 7/1057* (2013.01); *G11C 8/06* (2013.01); *H03K 3/02335* (2013.01); *H03K 3/356182* (2013.01); *H03K 19/018521* (2013.01); *G11C 5/147* (2013.01)

(58) Field of Classification Search
CPC ........ H03K 19/0185–018528; H03K 3/02335; H03K 3/356182; G11C 5/147; G11C 7/1057; G11C 8/06
See application file for complete search history.

(56) References Cited

U.S. PATENT DOCUMENTS

| | | |
|---|---|---|
| 6,084,430 A | 7/2000 | Wayner |
| 6,147,540 A | 11/2000 | Coddington |
| 6,346,829 B1 | 2/2002 | Coddington |
| 6,700,407 B1 | 3/2004 | Wert |
| 6,717,452 B2 | 4/2004 | Carpenter et al. |
| 6,965,251 B1 | 11/2005 | Tran et al. |
| 7,129,751 B2 | 10/2006 | Jahan et al. |
| 7,173,472 B2 | 2/2007 | Chen et al. |
| 8,258,848 B2 | 9/2012 | Chen |
| 8,339,177 B2 * | 12/2012 | Jarrar ............. H03K 19/018521 326/62 |
| 8,421,516 B2 | 4/2013 | Kumar et al. |

(Continued)

FOREIGN PATENT DOCUMENTS

EP 2680441 A2 1/2014

OTHER PUBLICATIONS

Chen, et al.; U.S. Appl. No. 15/603,252, filed May 23, 2017.
(Continued)

*Primary Examiner* — Patrick O Neill
(74) *Attorney, Agent, or Firm* — Pramudji Law Group PLLC; Ari Pramudji (57) ABSTRACT

Various implementations described herein are directed to an integrated circuit. The integrated circuit may include level shifting circuitry for translating an input signal from a first voltage domain to an output signal for a second voltage domain. The integrated circuit may include input logic circuitry for receiving multiple input signals and providing an inverted input signal to the level shifting circuitry based on the multiple input signals. The integrated circuit may include bypass switching circuitry for activating and deactivating the level shifting circuitry based on a bypass control signal and at least one of the multiple input signals.

20 Claims, 4 Drawing Sheets

(56) References Cited

U.S. PATENT DOCUMENTS

| | | | |
|---|---|---|---|
| 8,558,603 B2 * | 10/2013 | Hess | H03K 19/018521 |
| | | | 326/62 |
| 8,598,936 B2 | 12/2013 | Kuge et al. | |
| 8,872,570 B2 * | 10/2014 | Wu | H03K 3/35613 |
| | | | 327/333 |
| 9,054,660 B1 | 6/2015 | Ramalingam et al. | |
| 9,299,421 B1 | 3/2016 | Lien | |
| 9,515,660 B1 | 12/2016 | Samson et al. | |
| 9,647,660 B1 | 5/2017 | Alam et al. | |
| 2005/0077919 A1 * | 4/2005 | Sowden | G06F 1/3203 |
| | | | 326/62 |
| 2006/0255835 A1 | 11/2006 | Cordoba | |
| 2010/0264976 A1 | 10/2010 | Duby et al. | |
| 2011/0102383 A1 | 5/2011 | Cho | |
| 2012/0133416 A1 | 5/2012 | Ogawa | |
| 2012/0280739 A1 | 11/2012 | Foley | |
| 2014/0002146 A1 | 1/2014 | Kim | |
| 2014/0078815 A1 | 3/2014 | Hollis | |
| 2014/0097888 A1 | 4/2014 | Lee | |
| 2014/0117953 A1 | 5/2014 | Hoefler et al. | |
| 2016/0036441 A1 | 2/2016 | Dey et al. | |
| 2016/0036445 A1 | 2/2016 | Dey et al. | |
| 2016/0211847 A1 | 7/2016 | Duby et al. | |
| 2016/0294373 A1 | 10/2016 | Grubelich | |
| 2017/0012627 A1 | 1/2017 | Kapoor et al. | |
| 2017/0041002 A1 | 2/2017 | Dey et al. | |
| 2017/0288673 A1 * | 10/2017 | Nadkarni | G06F 1/3296 |
| 2018/0342271 A1 * | 11/2018 | Chen | G11C 8/10 |

OTHER PUBLICATIONS

Kim, et al.; SLC: Split-Control Level Converter for Dense and Stable Wide-Range Voltage Conversion; Proceedings of the ESSCIR; IEEE; pp. 478-481; Sep. 17, 2012 DOI: 10.1109/ESSCIRC.2012.6341359.

UKIPO Search Report; GB 1413492.8; dated Jan. 13, 2015.

UKIPO Search Report; GB 1413490.2; dated Jan. 14, 2015.

Lee, et al.; Wide-Range 5.0/3.3/1.8-V I/O Buffer Using 0.35-μm 3.3-V CMOS Technology; IEEE Transactions on Circuits and Systems I, Regular Papers; vol. 56, No. 4; Apr. 2009.

Chen, et la.; An Output Buffer for 3.3-V Applications in a 0.13-μm 1/2.5-V CMOS Process; IEEE Transactions on Circuits and Systems II, Express Briefs; vol. 54, No. 1; Jan. 2007.

Annema, et al.; 5.5-V I/O in a 2.5-V 0.25-μm CMOS Technology; IEEE Journal of Solid-State Circuits; vol. 36, No. 3; Mar. 2001.

* cited by examiner

310 — fabricating level shifting circuitry having a plurality of transistors arranged for translating an input signal from a first voltage domain to an output signal for a second voltage domain

320 — fabricating input logic circuitry that receives multiple input signals and provides an inverted input signal to the level shifting circuitry based on the multiple input signals

330 — fabricating bypass switching circuitry having a bypass transistor and an auxiliary transistor that operate as switches for activating and deactivating the level shifting circuitry based on a bypass control signal and at least one of the multiple input signals

FIG. 3

LEVEL SHIFTER WITH BYPASS CONTROL

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern circuit design, memory and related mechanisms support dual voltage rails for bitcell core (VDDCE) and periphery circuitry (VDDPE). VDDCE lowering is limited by bitcell retention voltage and is held at higher voltages compared to VDDPE. However, VDDPE lowering is usually limited by internal circuitry. Typically, VDDPE may potentially limit power savings on chip. Large range level shifting may require level shift of all inputs inside memory from low VDDPE to higher VDDCE domain, which may enable VDDPE to be lower than VDDCE. However, a disadvantage is that this implementation may cause delay penalty to all signals going through level shifters inside memory, which may lead to timing degradation, such as memory access time and input pins setup time.

Using level-shifters can introduce extra delay for input and output signals that increases input setup time and access time of memory. Further, level shifter topology can be prone to DC path issues during initial power-up and in case of floating inputs. Since the inputs are in another power domain, some operation modes allow them to be floating while the level shifter is powered-up, which results in a DC path passing through the level shifter. Sometimes, during initial power-up, the level shifter can resolve to a differential state slowly, and the level shifter may not be able to sustain a strong low voltage level on the output, since a pull-down path of the level shifter can be controlled by the other power domain. This results in a DC path for next stage gates, as well as power-up failures.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to schemes and techniques for implementing level shifting circuitry with bypass control. For instance, various implementations described herein provide schemes and techniques associated with integrated circuitry that utilizes level shifting circuitry, input logic circuitry, and bypass switching circuitry. The level shifting circuitry may be implemented for translating an input signal from a first voltage domain to an output signal for a second voltage domain that is different than the first voltage domain. The input logic circuitry may be implemented for receiving multiple input signals and providing an inverted input signal to the level shifting circuitry based on the multiple input signals. Further, the bypass switching circuitry may be implemented for activating and deactivating the level shifting circuitry based on a bypass control signal and at least one of the multiple input signals. In some scenarios, the schemes and techniques described herein may provide a high-speed level shifter with programmable bypass control. In other scenarios, the schemes and techniques described herein may provide a high-speed, high density large range level shifter with power gating isolation. Advantages of the various implementations described herein include providing reliable circuitry that allows for large range level shifting in memory circuitry by implementing a programmable bypass option for high speed applications.

Various implementations for providing level shifting circuitry with bypass control will now be described with reference to FIGS. 1-3.

Figure 1:
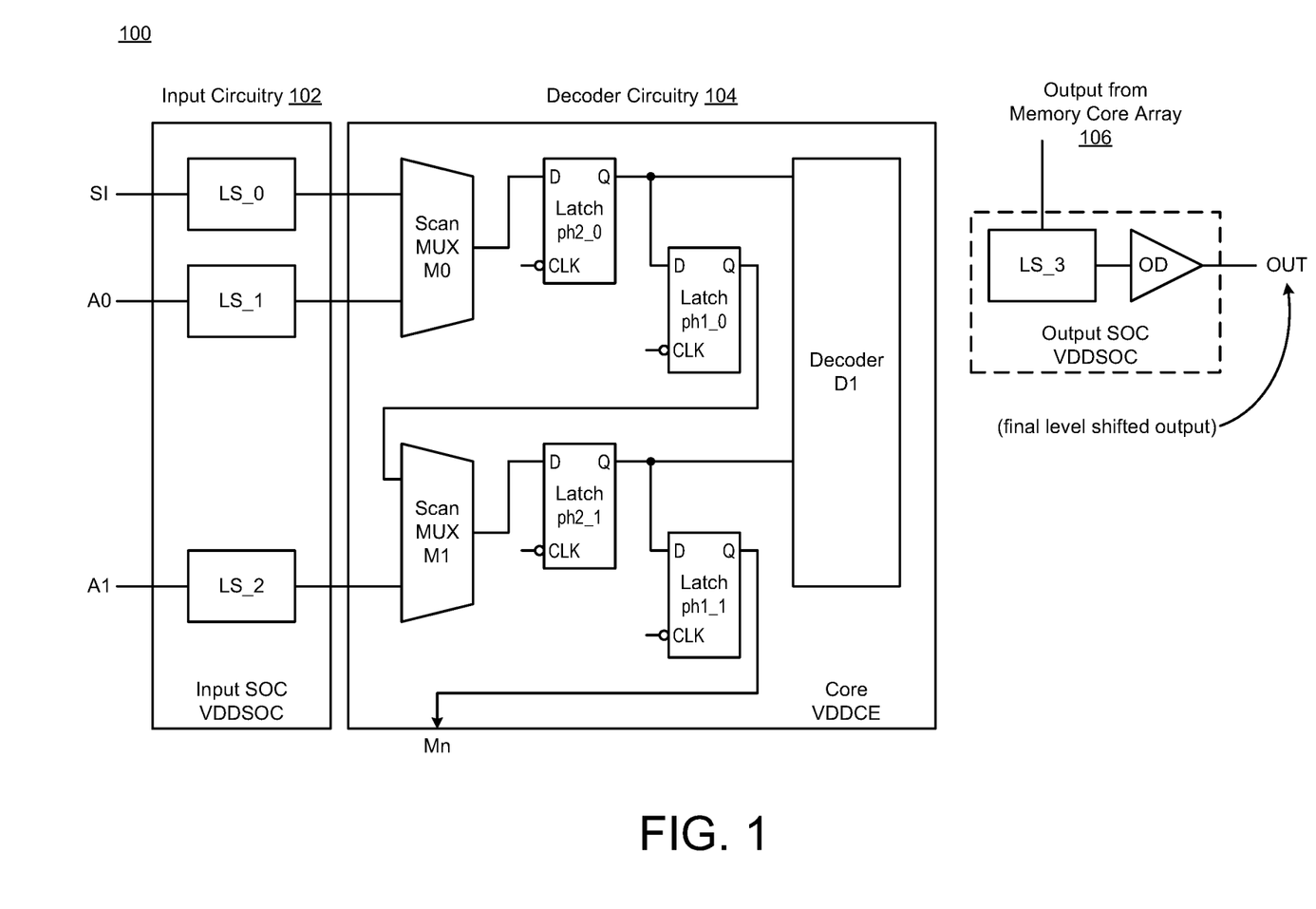
FIG. 1 illustrates a diagram of memory circuitry utilizing level shifting circuitry with bypass in accordance with implementations described herein.

FIG. 1 illustrates a block diagram of memory circuitry 100 using level shifting circuitry (LS) with bypass control functionality in accordance with various implementations described herein. As shown, the memory circuitry 100 may include associated circuitry, such as, e.g., input circuitry 102, decoder circuitry 104, and output from a memory core array 106 that may be implemented as an integrated circuit (IC) in various types of memory applications, such as, e.g., random access memory (RAM), and/or any other types of memory, including any type of volatile and non-volatile memory. In some cases, the memory circuitry 100 may be implemented as an IC with single or dual rail memory architecture. In other cases, the memory circuitry 100 may be integrated with various types of computing circuitry and/or various related components on a single chip. Further, the memory circuitry 100 may be implemented in an embedded system for various electronic and mobile applications.

As shown in FIG. 1, the input circuitry 102 may receive a signal input (SI) and one or more address signal inputs (A0, A1, . . . , An). The input circuitry 102 may include level shifting circuitry (LS_0, LS_1, LS_2) that may receive corresponding signal inputs (SI, A0, A1, etc.) and provide a level shifted output or a bypass signal output. The level shifting circuitry (LS_0, LS_1, LS_2) may be configured to translate the input signals (SI, A0, A1, etc.) from a first voltage domain to an output signal for a second voltage domain, and further, the level shifting circuitry (LS_0, LS_1, LS_2) may include bypass switching circuitry for activating and deactivating the level shifting circuitry (LS_0, LS_1, LS_2) based on a bypass control signal. The level shifting circuitry (LS_0, LS_1, LS_2) is further described herein below in reference to FIG. 2A. The second voltage domain may be different than the first voltage domain. For instance, in some implementations, the first voltage domain may be derived from a system-on-a-chip (SOC) logic voltage supply (VDDSOC), and the second voltage domain may be derived from a core voltage supply (VDDCE) or, in some cases, a periphery voltage supply (VDDPE).

As shown in FIG. 1, the input circuitry 102 may operate in the first voltage domain, such as, e.g., VDDSOC for input SOC, and the decoder circuitry 104 may operate in the second voltage domain, such as, e.g., VDDCE for core. Further, the output from the memory core array 106 may also operate in the first voltage domain, such as, e.g., VDDSOC for output SOC.

The memory circuitry 100 may further include a memory macro for a single port having one or more scan multiplexers M0, M1, one or more latches ph1, ph2, and a decoder D1 arranged to receive the signal inputs (SI, A0, A1, etc.). The first scan multiplexer M0 may receive the signal input (SI) and the first address signal (A0), as level shifted signals. The first scan multiplexer M0 may provide the first address signal (A0) or the signal input (SI) to the latch ph2_0, and the latch ph2_0 may receive and provide the first address signal (A0) or the signal input (SI) to the latch ph1_0 and the decoder D1 based on a clock signal (CLK). The latch ph1_0 may receive and provide the first address signal (A0) or the signal input (SI) to the second scan multiplexer M1 based on the clock signal (CLK).

The second scan multiplexer M1 may receive the second address signal (A1) and then provide the first address signal (A0), the signal input (SI) or the second address signal (A1) to another latch ph2_1 based on the clock signal (CLK). The latch ph2_1 may receive and provide the first address signal (A0), the signal input (SI) or the second address signal (A1) to another latch ph1_1 and the decoder D1 based on the clock signal (CLK). Further, as shown, the latch ph1_1 may receive and provide the first address signal (A0), the signal input (SI) or the second address signal (A1) as output to another scan multiplexer Mn (not shown) based on the clock signal (CLK).

The output from the memory core array 106 may include level shifting circuitry (LS_3) and an output driver (OD). As shown, one or more signals (SI, A0, A1, etc.) received from the latches ph1_0, ph1_1 may be received by the decoder D1, and the decoder D1 may provide a decoded signal to level shifting circuitry (LS_3). The level shifting circuitry (LS_3) may be configured to translate the input signals (SI, A0, A1, etc.) between first and second voltage domains, and the level shifting circuitry (LS_3) may include bypass switching circuitry for activating and deactivating the level shifting circuitry (LS_3) based on a bypass control signal, as described herein below in reference to FIG. 2. Further, as shown, the output driver (OD) of the output from the memory core array 106 may receive a level shifted signal from the level shifting circuitry (LS_3) and provide an output signal (OUT), which may include a final level shifted output.

In some implementations, the decoder circuitry 104 may comprise a scan cell having one or more D-flip-flops (DFFs). Generally, the DFF is a positive edge (posedge) triggered storage device. Internally, some DFFs may be provided with a ph2 D-latch (e.g., latch is open, when the clock is low) and a ph1 D-latch (e.g., latch is open, when the clock is high). The output Q of the DFF may serve as a scan output (SO) signal. As shown in FIG. 1, the decoder circuitry D1 may be configured as a MUX-DFF type scan cell having one or more multiplexers (MUXs), ph2 D-latches, and ph1 D-latches.

In reference to capturing and addressing input in RAM type macros, a memory may be described by processing a single transaction with each rise edge of a clock. For instance, to capture an address input during scan based testing, the ph1 latch may be added to the existing data paths, as shown in FIG. 1. The ph2 latch may be a functional latch that holds an address value while bitcells in the existing data paths are processed (i.e., memory bitcell transactions are initiated when clock is high). The ph1 latch may provide an effective scan DFF for addressing, and in this instance, the decoder circuitry D1 in FIG. 1 may be referred to as a RAM address observe cell.

Figure 2A:
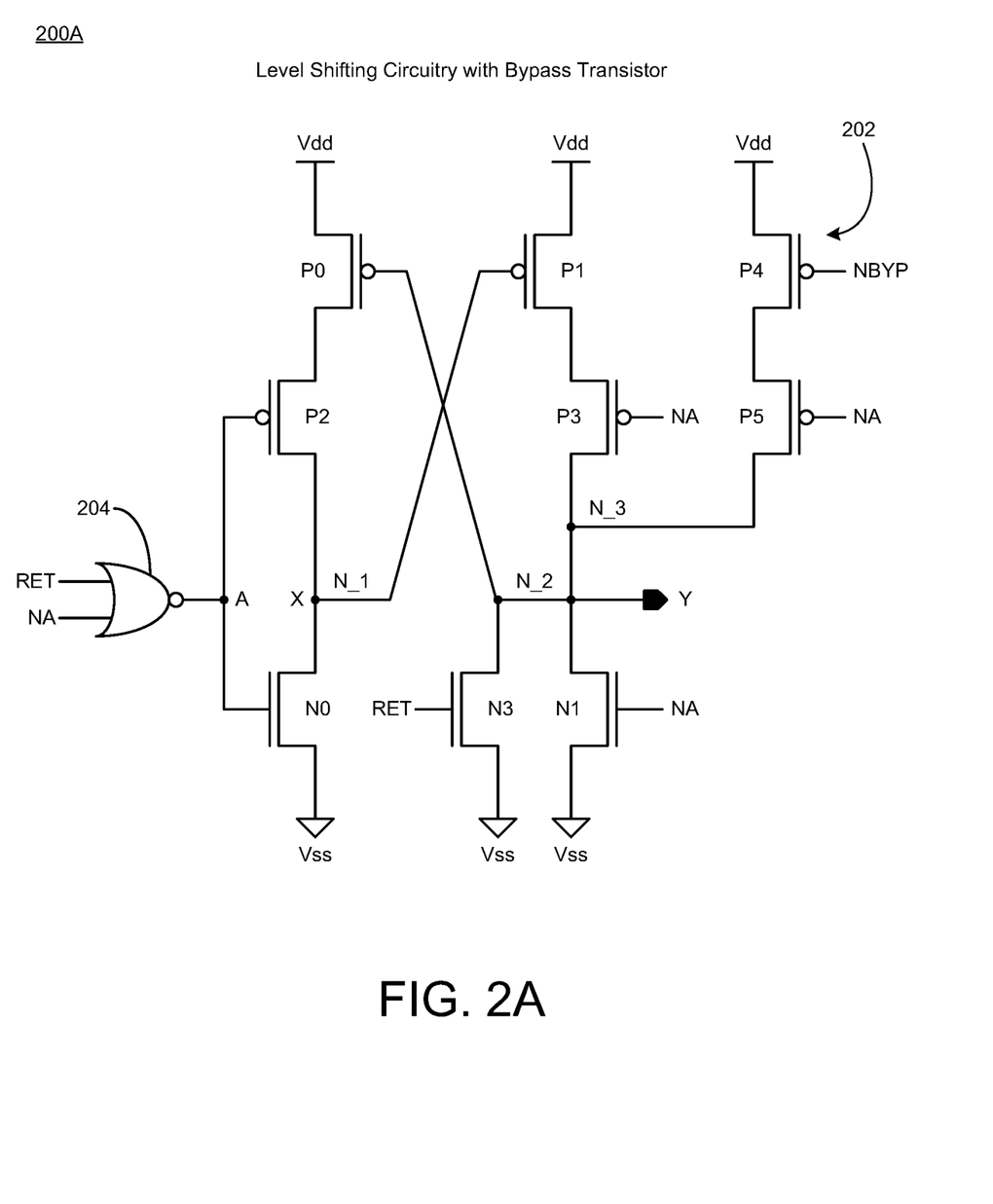
FIG. 2A illustrates a schematic diagram of level shifting circuitry with bypass control in accordance with implementations described herein.

FIG. 2A illustrates a schematic diagram of level shifting circuitry 200A with bypass transistor P4 in accordance with implementations described herein. FIG. 2A provides the level shifter circuitry 200A that allows for a large range of level shifting with a programmable bypass option for high speed applications. Further, FIG. 2A provides a schematic for the level shifter circuitry 200A having input/output pins, including, e.g., input signal NA (VDDSOC domain), input signal RET as an input control signal (VDDSOC domain), input signal A as an inverted input (VDDSOC domain), bypass signal NBYP as an input to turn the bypass feature ON or OFF (VDDCE domain), and output signal Y as a level shifted output signal for NA (VDDCE domain). In some instances, the RET signal may be implemented as a control signal that may be used to clamp nodes A, Y to VSSE (e.g., ground signal GND) while the inputs signals are floating. Further, in some instances, the bypass feature is ON when VDDCE>VDDSOC, and the bypass feature is OFF when VDDCE<+VDDSOC. However, other operational implementations are possible.

The circuitry 200A may be implemented as an integrated circuit (IC) when used in various types of memory applications, such as, e.g., a scan cell for random access memory (RAM), and/or any other types of memory, including any type of volatile and non-volatile memory. The circuitry 200A may be implemented as an IC with single or dual rail memory architecture, such as, e.g., single or dual port memory architecture. The circuitry 200A may be integrated with various types of computing circuitry and/or various related components on a single chip. The circuitry 200A may be implemented in an embedded system for various electronic and mobile applications. The circuitry 200A as an integrated circuit (IC) may be configured for memory applications that support large range level shifting to enable dynamic voltage frequency scaling in multiple voltage domains.

Further, the circuitry 200A as an integrated circuit (IC) may be configured to allow large range of level shifting in memory applications that aims to minimize delay overhead when level shifting is not required and that inhibits (or prevents) potential issues related to DC path during initial power-up and in the case of floating inputs. The circuitry 200A addresses the DC path issues of a conventional level-shifter. For instance, the circuitry 200A generates signal A using the NOR2 gate 204 with input signals RET and NA. The RET signal clamps signal A to VSSE (or VSS) during power-up and when in retention or power-down modes in which the inputs may be floating. The RET signal also clamps the output node Y to VSSE (or VSS) so that the level shifting circuitry 200A will resolve in a known state of Y=0 and X=VDDCE.

FIG. 2A shows level shifting circuitry 200A for translating an input signal (NA) from a first voltage domain to an output signal (Y) for a second voltage domain. As shown, the level shifting circuitry 200A may also implement input logic circuitry 204 for receiving multiple input signals (NA, RET) and providing an inverted input signal (A) to the level shifting circuitry 200A based on the multiple input signals (NA, RET). Further, the level shifting circuitry 200A may implement bypass switching circuitry 202 for activating and deactivating the level shifting circuitry 200A based on a bypass control signal (NBYP) and at least one of the multiple input signals (such as, e.g., NA). The second voltage domain may be different than the first voltage domain. For instance, the first voltage domain may be derived from a system-on-a-chip (SOC) logic voltage supply (VDDSOC), and the second voltage domain may be derived from a core voltage supply (VDDCE) or, in some cases, a periphery voltage supply (VDDPE).

In some implementations, the input logic circuitry 204 may include a NOR gate that receives the multiple input signals (NA, RET) and provides the inverted input signal (A) to the level shifting circuitry 200A based on the multiple input signals (NA, RET). In other scenarios, various other types of input logic circuitry and/or gates may be used.

In some implementations, the level shifting circuitry 200A may include a plurality of transistors (P0, P1, P2, P3, N0, N1, N3) that are arranged for receiving and translating the inverted input signal (A) from the first voltage domain to the output signal (Y) for the second voltage domain. As shown, the plurality of transistors (P0, P1, P2, P3, N0, N1, N3) may include multiple p-type metal-oxide-semiconductor (PMOS) transistors (P0, P1, P2, P3) and multiple n-type MOS (NMOS) transistors (N0, N1, N3) that may be arranged for receiving and translating the inverted input signal (A) from the first voltage domain to the output signal (Y) for the second voltage domain.

As shown in FIG. 2A, the transistors P0, P2, N0 may be coupled in series (i.e., stacked) between a first supply voltage (Vdd) and a second voltage supply (Vss or Gnd), and the transistors P1, P3, N1 may be coupled in series (i.e., stacked) between the first supply voltage (Vdd) and the second voltage supply (Vss or Gnd). The transistor N3 may be coupled in parallel with the transistor N1. The transistors P2, N0 may receive the inverted input signal (A) via gates thereof, and a first node (N_1) or input node (X) may be disposed therebetween. The transistors P3, N1 may receive the input signal (NA) via gates thereof, and a second node (N_2) may be disposed therebetween. The transistors N1, N3 may be coupled between the second node (N_2) and the second voltage supply (Vss), and the transistor N3 may receive the input signal (RET) via a gate thereof. The transistors P0, P1 may be cross-coupled via the first node (N_1) and the second node (N_2). The output signal (Y) may be provided as output via the second node (N_2), which may be referred to as an output node (Y).

The bypass switching circuitry 202 may include at least one bypass transistor P4 that is coupled to the level shifting circuitry 200A. As shown, the bypass transistor P4 may be implemented with a PMOS transistor. However, in other implementations, the bypass transistor P4 may be implemented with an NMOS transistor. The bypass transistor P4 may operate as a switch for activating and deactivating the level shifting circuitry 200A based on the bypass control signal (NBYP). As shown in FIG. 2A, the bypass transistor P4 may be disposed between the first voltage supply (Vdd) and a third node (node_3), which is disposed between the transistors P1, P3.

The bypass switching circuitry 202 may include an auxiliary transistor P5 that is coupled to the bypass transistor P4, and the auxiliary transistor P5 may be activated based on at least one of the multiple input signals (such as, e.g., NA). As shown in FIG. 2A, the auxiliary transistor P5 may be disposed between the bypass transistor P4 and a third node or output node (N_3), which is disposed between the transistors P1, P3. As shown, the output node (N_3) may be coupled to the second node (N_2), as one in the same, which is disposed between the transistors P3, N1, N3. Therefore, the second and third nodes (N_2, N_3) may be referred to as the output node.

Further, the plurality of transistors may include the transistor N3, which may be referred to as an output control transistor that is coupled to an output node (N_3) of the level shifting circuitry 200A, and the output control transistor N3 may be activated based on at least one of the multiple input signals (e.g., RET). The output control transistor N3 may be implemented with an NMOS transistor that is coupled between the second node (N_2) and the second voltage supply (Vss). However, in some other scenarios, the output control transistor N3 may be implemented with a PMOS transistor. Further, as shown, the output node (N_3) may be coupled to the second node (N_2), as one in the same, which is disposed between the transistors P3, N1, N3. Therefore, the second and third nodes (N_2, N_3) may be referred to as the output node.

Various implementations described herein provide for level shifter circuitry that allows large range of level shifting by minimizing delay overhead when level shifting is not required and by operating reliably during power-up and while inputs are floating. In some instances, the level shifting schemes and techniques described herein implement a level shifting range of approximately 0.5V to 1.0V. In reference to FIG. 2A, differential inputs (A, NA) control pull-down devices to discharge the internal nodes that turns ON the pull-up path, wherein an extra pull-up path is controlled by the NBYP signal. If bypass feature is ON, this extra path pulls-up node Y as fast as a single stage gate. The level shifting circuitry 200A generates the input signal A using the NOR gate 204 with input signals RET and NA. The input signal RET clamps signal A to VSSE (i.e., Vss or Gnd) during power-up and when in retention or power-down modes in which the inputs may be floating. The input signal RET may be used to clamp the output node Y to VSSE, so that the level shifting circuitry 200A resolves in a known state of Y=0, and X=VDDCE.

In some scenarios, deactivating the level shifting circuitry 200A with the bypass switching circuitry 202 increases speed performance of the integrated circuit by providing a quicker (or faster) path for the input signal (NA) to propagate through the integrated circuit. In other scenarios, deactivating the level shifting circuitry 200A with the bypass switching circuitry 202 reduces timing delay of the integrated circuit by allowing the input signal (NA) to bypass the level shifting circuitry 200A. In some other scenarios, activating the level shifting circuitry 200A with the bypass switching circuitry 202 increases timing delay of the integrated circuit by passing the input signal (NA) through the level shifting circuitry 200A. Further, the level shifting circuitry 200A as an integrated circuit (IC) may be configured for memory applications that support large range level shifting by reducing delay overhead when level shifting is not required and operates reliably during power-up and while the multiple input signals are floating. Also, the level shifting circuitry 200A as an integrated circuit (IC) may be configured for memory applications that support large range level shifting by inhibiting potential issues related to DC path during initial power-up and in case of floating inputs.

One advantage of the level shifter circuitry 200A is that, during times when SOC is not using DVFS (Dynamic Voltage and Frequency Scaling), where VDDSOC=VDDCE, and where memory PPA (Power, Performance and Area) may be important, the pin-programmable option may be used to turn the bypass transistor ON. In this instance, the transistor gate may be coupled to the NBYP pin input, which may be controlled by the SOC. Further, in some instances, turning the bypass transistor ON may provide a quicker path for the input signal to propagate through the circuit thereby reducing timing delay that it may have taken through a conventional level shifter without the bypass option.

Further, in reference to FIG. 1, during bypass mode ON, level shifting circuitry (LS) may have a single stage delay penalty, and during bypass mode OFF, level shifting circuitry (LS) may have a multiple stage delay (e.g., 2 or 3 stage delay penalty). Overall, from a memory timing perspective, at the PPA corner, the bypass option may be turned ON to thereby reduce timing delay penalties related to setup times at the input circuitry 102 and memory access time (CLK-to-Q) at the output OUT.

Without bypass switching circuitry, a conventional level-shifter may have one or more DC path issues. For instance, during initial power-up, if A/NA (in VDDSOC that is not powered up yet) and all internal nodes are VSSE, the conventional level-shifter will resolve in a random state according to random mismatch between mainly the PMOS pull-up devices. Previous silicon implementations have shown failures for VDDCE ramp-up due to extreme DC current during this slow resolution time. Also, even after resolving into a logic-0 state, the output node Y cannot stay low since it does not have a path to VSSE (both NMOS devices are off since A/NA are not powered up).

Therefore, to overcome this deficiency above of the conventional level-shifter, the bypass switching circuitry 202 described herein may operate as follows. The RET signal is in VDDCE domain, and the RET signal ramps up with VDDCE power-up. The RET signal clamps A to VSSE during power-up, and the RET signal clamps the output node Y to VSSE so that the level shifter circuitry 200A will resolve in a known state of Y=0 and X=VDDCE. With this scheme, the resolution time may be much faster, so that the DC path during initial power-up is minimized. Also, in some instances, the output node Y may only bump-up to, e.g., 15 mV before clamping to VSSE, and the output node Y may stay at VSSE. Therefore, the static DC path may be inhibited or prevented for the next gate that uses Y as the input. Also, in some instances, inhibiting or preventing the static DC path may also eliminate the possibility of not being able to power-up VDDCE.

Further, in some other instances, when in a memory operation mode, such as retention, VDDSOC may be floating when VDDCE is ON. Since inputs in VDDSOC may be floating, this floating aspect may cause a DC path through the conventional level-shifter without bypass switching circuitry. Thus, to overcome this deficiency of the conventional level-shifter, the level shifter circuitry 200A having the bypass switching circuitry 202 described herein may operate as follows. The level shifter circuitry 200A described herein may resolve various DC path issues when internal nodes are floating by clamping the internal nodes and forcing a specific state. For instance, the RET signal may clamp A to VSSE during/when in retention mode in which inputs may be floating, and the RET signal may clamp the output node Y to VSSE, so that level shifter circuitry 200A will stay in a known state of Y=0 and X=VDDCE.

Figure 2B:
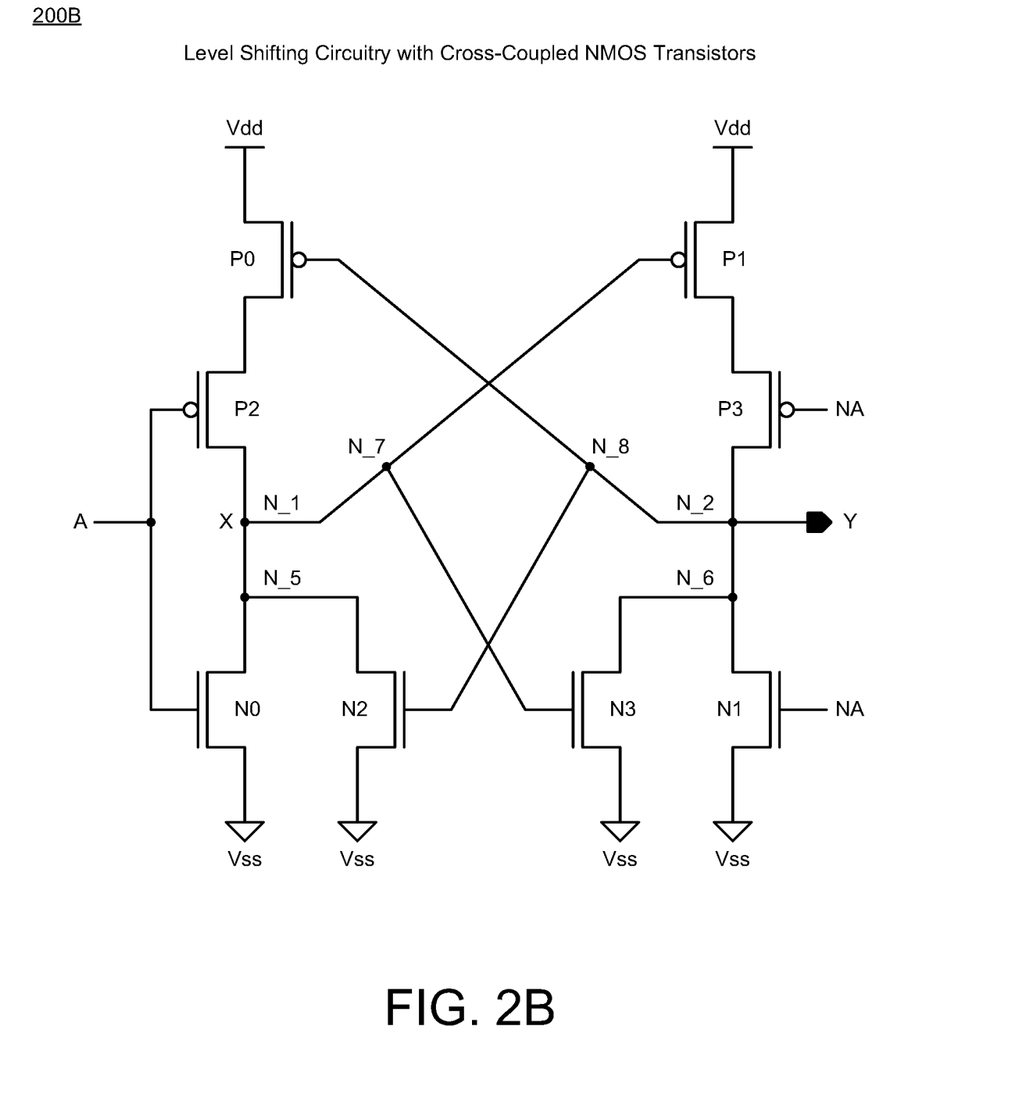
FIG. 2B illustrates a schematic diagram of level shifting circuitry with cross-coupled transistors in accordance with implementations described herein.

FIG. 2B illustrates a schematic diagram of level shifting circuitry 200B with cross-coupled transistors N2, N3 in accordance with various implementations described herein. FIG. 2B provides a schematic diagram for the level shifter circuitry 200B having input/output pins, including, e.g., input signal A (VDDSOC domain) and output signal Y as a level shifted output signal for A (VDDCE domain). Some components, such as, e.g., the transistors (P0, P1, P2, P3, N0, N1, N3), provided in the circuitry 200B of FIG. 2B are similar in scope and function as in the circuitry 200A of FIG. 2A.

The circuitry 200B may be implemented as an integrated circuit (IC) when used in various types of memory applications, such as, e.g., a scan cell for random access memory (RAM), and/or any other types of memory, including any type of volatile and non-volatile memory. The circuitry 200B may be implemented as an IC with single or dual rail memory architecture, such as, e.g., single or dual port memory architecture. The circuitry 200B may be integrated with various types of computing circuitry and/or various related components on a single chip. The circuitry 200B may be implemented in an embedded system for various electronic and mobile applications. The circuitry 200B as an integrated circuit (IC) may be configured for memory applications that support large range level shifting to enable dynamic voltage frequency scaling in multiple voltage domains.

FIG. 2B shows level shifting circuitry 200B for translating an input signal (A) from a first voltage domain to an output signal (Y) for a second voltage domain that may be different than the first voltage domain. For instance, the first voltage domain may be derived from the VDDSOC domain, and the second voltage domain may be derived from the VDDCE domain or, in some cases, the VDDPE domain.

In some implementations, the level shifting circuitry 200B may include multiple transistors (P0, P1, P2, P3, N0, N1, N3) that are arranged for receiving and translating the input signal (A) from the first voltage domain to the output signal (Y) for the second voltage domain. As shown, the plurality of transistors (P0, P1, P2, P3, N0, N1, N3) may include multiple PMOS transistors (P0, P1, P2, P3) and multiple NMOS transistors (N0, N1, N3) that may be arranged for receiving and translating the input signal (A) from the first voltage domain to the output signal (Y) for the second voltage domain. The multiple transistors may further include NMOS transistor N2, which is coupled in parallel with the NMOS transistor N0, and the NMOS transistor N2 may be coupled between a fifth node (N_5) and the second voltage supply (Vss). The first node (N_1) may be referred to as the input node (X), and the first node (N_1) may be coupled to the fifth node (N_5).

As shown in FIG. 2B, the transistors P0, P2, N0 may be coupled in series (i.e., stacked) between the first supply voltage (Vdd) and the second voltage supply (Vss or Gnd), and the transistor N2 may be coupled in parallel with the transistor N0. Further, the transistors P1, P3, N1 may be coupled in series (i.e., stacked) between the first supply voltage (Vdd) and the second voltage supply (Vss), and the transistor N3 may be coupled in parallel with the transistor N1. The transistors P2, N0 may receive the input signal (A) via gates thereof, and the first node (N_1) may be disposed therebetween. The transistors P0, P1 may be cross-coupled via the first node (N_1) and the second node (N_2), and the output signal (Y) may be provided as output via the second node (N_2). The fifth node (N_5) may be coupled to the first node (N_1), which may be referred to as the input node (X). The transistors N0, N2 may be coupled between the first node (N_1) and the second voltage supply (Vss), and the transistor N2 may be cross-coupled with the transistor N3 at an eighth node (N_8). The transistors P3, N1 may receive the input signal (NA) via gates thereof, and the second node (N_2) may be disposed therebetween. As shown, a sixth node (N_6) may be coupled to the second node (N_2), which may be referred to as the output node (Y). The transistors N1, N3 may be coupled between the second node (N_2) and the second voltage supply (Vss), and the transistor N3 may be cross-coupled with the transistor N2 at a seventh node (N_7).

The level shifting circuitry 200B may resolve the initial power-up DC path issue by using the cross-coupled NMOS transistors N2, N3 to assist the circuitry 200B to resolve faster and provides a path to VSSE for nodes X and Y. However, in some instances, the DC path issue may not be resolved when the input nodes are floating. In some scenarios, the level shifting circuitry 200B aims to resolve an initial power-up DC path issue by introducing the cross-coupled NMOS transistors N2, N3 to assist the circuitry 200B to resolve faster and to provide a path to VSSE (or VSS) for nodes X and Y. However, sometimes, the level shifting circuitry 200B may not solve the DC path issue when the input nodes are floating.

Figure 3:
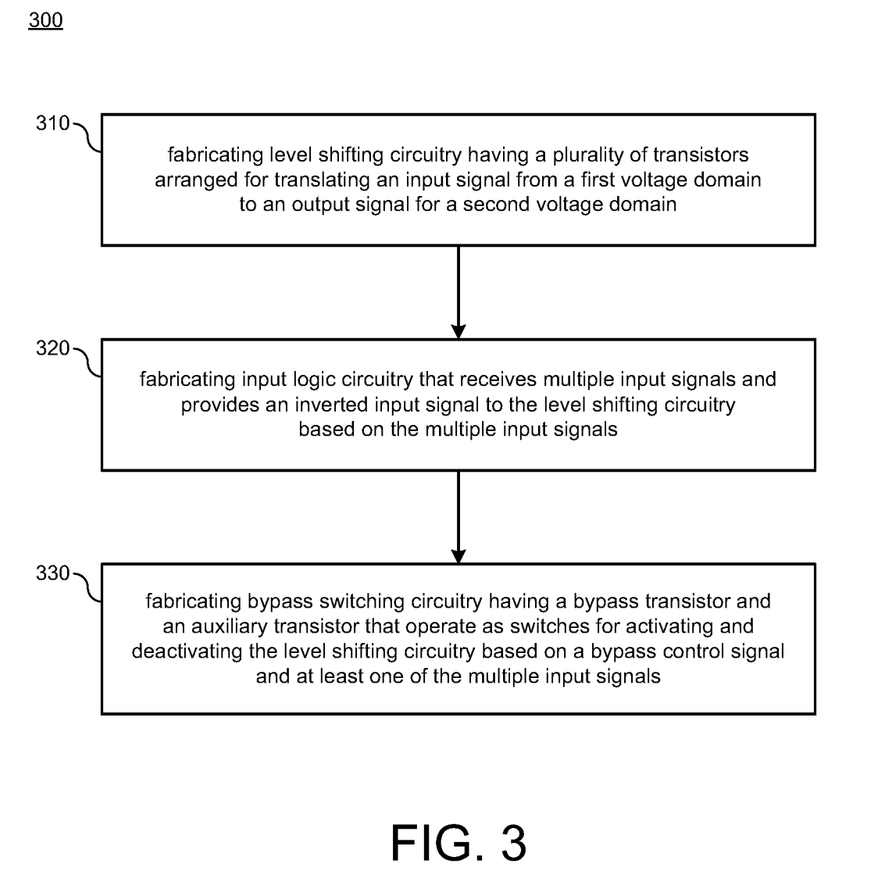
FIG. 3 illustrates a process diagram of a method for fabricating level shifting circuitry with bypass control in accordance with implementations described herein.

FIG. 3 illustrates a process flow diagram of a method 300 for manufacturing, fabricating, and/or producing level shifting circuitry with bypass control in accordance with various implementations described herein.

It should be understood that even though method 300 may indicate a particular order of operation execution, various certain portions of the operations may be executed in a different order, and on different systems. In some cases, additional operations and/or steps may be added to and/or omitted from method 300. Further, method 300 may be implemented in hardware and/or software. If implemented in hardware, method 300 may be implemented with various circuit components, as described herein above in reference to FIGS. 1-2B. If implemented in software, method 300 may be implemented, e.g., as a program or software instruction process that may be configured for implementing level shifting circuitry with bypass control as described herein above. Further, if implemented in software, various instructions related to implementing method 300 may be stored or recorded in various types of memory. For instance, a computer, a server, or various other types of computing devices having a processor and memory may be configured to execute and perform method 300.

In reference to the process diagram of FIG. 3, method 300 may be utilized for manufacturing an integrated circuit for implementing level shifting circuitry with bypass control. The integrated circuit may be configured for memory applications that support large range level shifting by reducing delay overhead when level-shifting is not required and operates reliably during power-up and while the multiple input signals are floating. Further, the integrated circuit may be configured for memory applications that support large range level shifting by inhibiting potential issues related to DC path during initial power-up and in case of floating inputs.

In some implementations, at block 310, method 300 may fabricate level shifting circuitry having a plurality of transistors arranged for translating an input signal from a first voltage domain to an output signal for a second voltage domain. The second voltage domain is different than the first voltage domain. The first voltage domain is derived from a system-on-a-chip (SOC) logic voltage supply (VDDSOC), and the second voltage domain is derived from a core voltage supply (VDDCE).

The level shifting circuitry may include a plurality of transistors arranged for translating the input signal from the first voltage domain to the output signal for the second voltage domain. In some instances, the plurality of transistors may include one or more PMOS transistors and one or more NMOS transistors that are arranged for translating the input signal from the first voltage domain to the output signal for the second voltage domain. The plurality of transistors may include an output control transistor coupled to an output node of the level shifting circuitry, and the output control transistor may be activated based on at least one of the multiple input signals.

At block 320, method 300 may fabricate input logic circuitry for receiving multiple input signals and providing an inverted input signal to the level shifting circuitry based on the multiple input signals. The input logic circuitry may include a NOR gate that receives the multiple input signals and provides the inverted input signal to the level shifting circuitry based on the multiple input signals.

At block 330, method 300 may fabricate bypass switching circuitry having a bypass transistor and an auxiliary transistor that operate as switches for activating and deactivating the level shifting circuitry based on a bypass control signal and at least one of the multiple input signals. The bypass switching circuitry may include a bypass transistor that is coupled to the level shifting circuitry, and the bypass transistor may operate as a switch for activating and deactivating the level shifting circuitry based on the bypass control signal. The bypass switching circuitry may include an auxiliary transistor coupled to the bypass transistor, and the auxiliary transistor may be activated based on at least one of the multiple input signals.

In some instances, activating the level shifting circuitry with the bypass switching circuitry may increase timing delay of the integrated circuit by passing the input signal through the level shifting circuitry. In other instances, deactivating the level shifting circuitry with the bypass switching circuitry may increase speed performance of the integrated circuit by providing a quicker path for the input signal to propagate through the integrated circuit. In some other instances, deactivating the level shifting circuitry with the bypass switching circuitry may reduce timing delay of the integrated circuit by allowing the input signal to bypass the level shifting circuitry.

Described herein are various implementations of an integrated circuit. The integrated circuit may include level shifting circuitry for translating an input signal from a first voltage domain to an output signal for a second voltage domain. The integrated circuit may include input logic circuitry for receiving multiple input signals and providing an inverted input signal to the level shifting circuitry based on the multiple input signals. The integrated circuit may include bypass switching circuitry for activating and deactivating the level shifting circuitry based on a bypass control signal and at least one of the multiple input signals.

Described herein are various implementations of an integrated circuit. The integrated circuit may include level shifting circuitry having a plurality of transistors arranged to translate an input signal from a first voltage domain to an output signal for a second voltage domain. The integrated circuit may include input logic circuitry that receives multiple input signals and provides an inverted input signal to the level shifting circuitry based on the multiple input signals. The integrated circuit may include bypass switching circuitry having a bypass transistor and an auxiliary transistor that operate as switches to activate and deactivate the level shifting circuitry based on a bypass control signal and at least one of the multiple input signals.

Described herein are various implementations of a method for manufacturing an integrated circuit. The method may include fabricating level shifting circuitry having a plurality of transistors arranged for translating an input signal from a first voltage domain to an output signal for a second voltage domain. The method may include fabricating input logic circuitry for receiving multiple input signals and providing an inverted input signal to the level shifting circuitry based on the multiple input signals. The method may include fabricating bypass switching circuitry having a bypass transistor and an auxiliary transistor that operate as switches for activating and deactivating the level shifting circuitry based on a bypass control signal and at least one of the multiple input signals.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   level shifting circuitry for translating an input signal from a first voltage domain to an output signal for a second voltage domain;
   input logic circuitry for receiving multiple input signals and providing an inverted input signal to the level shifting circuitry based on the multiple input signals; and
   bypass switching circuitry for activating and deactivating the level shifting circuitry based on a bypass control signal and at least one of the multiple input signals.

2. The integrated circuit of claim 1, wherein the second voltage domain is different than the first voltage domain.

3. The integrated circuit of claim 1, wherein the first voltage domain is derived from a system-on-a-chip (SOC) logic voltage supply (VDDSOC), and wherein the second voltage domain is derived from a core voltage supply (VDDCE).

4. The integrated circuit of claim 1, wherein the input logic circuitry comprises a NOR gate that receives the multiple input signals and provides the inverted input signal to the level shifting circuitry based on the multiple input signals.

5. The integrated circuit of claim 1, wherein the level shifting circuitry comprises a plurality of transistors arranged for translating the input signal from the first voltage domain to the output signal for the second voltage domain.

6. The integrated circuit of claim 5, wherein the plurality of transistors include P-type metal-oxide-semiconductor (PMOS) transistors and N-type MOS (NMOS) transistors that are arranged for translating the input signal from the first voltage domain to the output signal for the second voltage domain.

7. The integrated circuit of claim 5, wherein the plurality of transistors include an output control transistor coupled to an output node of the level shifting circuitry, and wherein the output control transistor is activated based on at least one of the multiple input signals.

8. The integrated circuit of claim 1, wherein the bypass switching circuitry comprises a bypass transistor that is coupled to the level shifting circuitry, and wherein the bypass transistor operates as a switch for activating and deactivating the level shifting circuitry based on the bypass control signal.

9. The integrated circuit of claim 8, wherein the bypass switching circuitry comprises an auxiliary transistor coupled to the bypass transistor, and wherein the auxiliary transistor is activated based on at least one of the multiple input signals.

10. The integrated circuit of claim 1, wherein deactivating the level shifting circuitry with the bypass switching circuitry increases speed performance of the integrated circuit by providing a quicker path for the input signal to propagate through the integrated circuit, and wherein deactivating the level shifting circuitry with the bypass switching circuitry reduces timing delay of the integrated circuit by allowing the input signal to bypass the level shifting circuitry.

11. The integrated circuit of claim 1, wherein activating the level shifting circuitry with the bypass switching circuitry increases timing delay of the integrated circuit by passing the input signal through the level shifting circuitry.

12. The integrated circuit of claim 1, wherein the integrated circuit is configured for resolving DC path issues when internal nodes are floating by clamping the internal nodes and forcing a specific state.

13. The integrated circuit of claim 1, wherein the integrated circuit is configured for memory applications that support large range level shifting by reducing delay overhead when level-shifting is not required and by inhibiting potential issues related to DC path during initial power-up and in case of floating inputs.

14. An integrated circuit, comprising:
level shifting circuitry having a plurality of transistors arranged to translate an input signal from a first voltage domain to an output signal for a second voltage domain;
input logic circuitry that receives multiple input signals and provides an inverted input signal to the level shifting circuitry based on the multiple input signals; and
bypass switching circuitry having a bypass transistor and an auxiliary transistor that operate as switches to activate and deactivate the level shifting circuitry based on a bypass control signal and at least one of the multiple input signals.

15. The integrated circuit of claim 14, wherein the input logic circuitry comprises a NOR gate that receives the multiple input signals and provides the inverted input signal to the level shifting circuitry based on the multiple input signals.

16. The integrated circuit of claim 14, wherein the level shifting circuitry comprises a plurality of transistors arranged for translating the input signal from the first voltage domain to the output signal for the second voltage domain.

17. The integrated circuit of claim 16, wherein the plurality of transistors include an output control transistor coupled to an output node of the level shifting circuitry, and wherein the output control transistor is activated based on at least one of the multiple input signals.

18. The integrated circuit of claim 14, wherein the bypass transistor operates as a switch for activating and deactivating the level shifting circuitry based on the bypass control signal, and wherein the auxiliary transistor is coupled to the bypass transistor, and wherein the auxiliary transistor is activated based on at least one of the multiple input signals.

19. The integrated circuit of claim 14, wherein the integrated circuit is configured for memory applications that support large range level shifting by reducing delay overhead when level-shifting is not required and by inhibiting potential issues related to DC path during initial power-up and in case of floating inputs, and wherein the integrated circuit is configured for resolving DC path issues when internal nodes are floating by clamping the internal nodes and forcing a specific state.

20. A method for manufacturing an integrated circuit, the method comprising:
fabricating level shifting circuitry having a plurality of transistors arranged for translating an input signal from a first voltage domain to an output signal for a second voltage domain;
fabricating input logic circuitry for receiving multiple input signals and providing an inverted input signal to the level shifting circuitry based on the multiple input signals; and
fabricating bypass switching circuitry having a bypass transistor and an auxiliary transistor that operate as switches for activating and deactivating the level shifting circuitry based on a bypass control signal and at least one of the multiple input signals.

* * * * *